US010879415B2

(12) United States Patent
Kwon et al.

(10) Patent No.: US 10,879,415 B2
(45) Date of Patent: Dec. 29, 2020

(54) PHOTODETECTOR, PHOTODETECTION SYSTEM, LIDAR APPARATUS, VEHICLE, AND METHOD OF MANUFACTURING PHOTODETECTOR

(71) Applicant: Kabushiki Kaisha Toshiba, Minato-ku (JP)

(72) Inventors: Honam Kwon, Kawasaki (JP); Toshiya Yonehara, Kawasaki (JP); Hitoshi Yagi, Yokohama (JP); Ikuo Fujiwara, Yokohama (JP); Kazuhiro Suzuki, Minato (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/265,236

(22) Filed: Feb. 1, 2019

(65) Prior Publication Data

US 2019/0165198 A1 May 30, 2019

Related U.S. Application Data

(63) Continuation-in-part of application No. 15/912,048, filed on Mar. 5, 2018, now abandoned.

(30) Foreign Application Priority Data

Jun. 23, 2017 (JP) .................... 2017-123069
Jun. 15, 2018 (JP) .................... 2018-114887

(51) Int. Cl.
*G01C 3/08* (2006.01)
*H01L 31/107* (2006.01)
*G01S 17/89* (2020.01)
*H01L 31/028* (2006.01)
*H01L 31/18* (2006.01)
(Continued)

(52) U.S. Cl.
CPC .......... *H01L 31/107* (2013.01); *G01S 7/497* (2013.01); *G01S 17/89* (2013.01); *H01L 31/028* (2013.01); *H01L 31/02327* (2013.01); *H01L 31/03529* (2013.01); *H01L 31/035281* (2013.01); *H01L 31/102* (2013.01); *H01L 31/1804* (2013.01); *B60W 40/02* (2013.01); *B60W 2420/52* (2013.01)

(58) Field of Classification Search
CPC .............. H01L 31/107; H01L 31/028; H01L 31/02327; H01L 31/03529; B60W 40/02; B60W 2420/52; G01S 17/89; G01S 7/497
USPC ........................................... 356/4.01
See application file for complete search history.

(56) References Cited

U.S. PATENT DOCUMENTS 6,031,231 A * 2/2000 Kimata .................. G01J 5/08
  250/332
6,483,098 B1 11/2002 Kato et al.
(Continued)

FOREIGN PATENT DOCUMENTS

JP       3152907       4/2001
JP    2002-299596    10/2002
(Continued)

*Primary Examiner* — Mark Hellner
(74) *Attorney, Agent, or Firm* — Oblon, McClelland, Maier & Neustadt, L.L.P.

(57) ABSTRACT

A photodetector includes a first semiconductor layer and a second semiconductor layer provided on the first semiconductor layer and detecting light. The first semiconductor layer has a cavity portion for reflecting incident light.

22 Claims, 9 Drawing Sheets

(51) Int. Cl.
  *H01L 31/0232*   (2014.01)
  *H01L 31/0352*   (2006.01)
  *G01S 7/497*     (2006.01)
  *H01L 31/102*    (2006.01)
  *B60W 40/02*     (2006.01)

(56) References Cited

U.S. PATENT DOCUMENTS

| | | |
|---|---|---|
| 6,576,556 B2 | 6/2003 | Kimata et al. |
| 8,803,263 B2 | 8/2014 | Yamada et al. |
| 2004/0188787 A1 | 9/2004 | Yang et al. |
| 2005/0110059 A1 | 5/2005 | Kato |
| 2013/0119501 A1 | 5/2013 | Yoshida |
| 2014/0339398 A1 | 11/2014 | Mazzillo et al. |
| 2016/0285020 A1* | 9/2016 | Huang .................. H01L 51/428 |
| 2017/0299699 A1 | 10/2017 | Yonehara et al. |
| 2017/0314989 A1* | 11/2017 | Mazzillo ................. G01J 1/429 |
| 2018/0000364 A1 | 1/2018 | Yonehara et al. |
| 2018/0000365 A1 | 1/2018 | Yonehara et al. |
| 2018/0019444 A1 | 1/2018 | Yonehara et al. |
| 2019/0285732 A1* | 9/2019 | Retterath ................ G01S 17/93 |

FOREIGN PATENT DOCUMENTS

| | | |
|---|---|---|
| JP | 2004-304187 | 10/2004 |
| JP | 2005-175442 | 6/2005 |
| JP | 2012-177696 | 9/2012 |
| JP | 5450295 | 3/2014 |
| JP | 2017-98399 | 6/2017 |

\* cited by examiner

PHOTODETECTOR, PHOTODETECTION SYSTEM, LIDAR APPARATUS, VEHICLE, AND METHOD OF MANUFACTURING PHOTODETECTOR

CROSS-REFERENCE TO RELATED APPLICATIONS

This application a continuation in part of and claims the benefit of priority under 35 U.S.C. § 120 from application Ser. No. 15/912,048 filed Mar. 5, 2018, the entire contents of which are incorporated herein by reference. This application claims the benefit of priority under 35 U.S.C. § 119 from Japanese Patent Application No. 2017-123069 filed Jun. 23, 2017 and Japanese Patent Application No. 2018-114887 filed Jun. 15, 2018, the entire contents of which are incorporated herein by reference.

FIELD

Embodiments relate to a photodetector, a photodetection system, LIDAR apparatus, vehicle, and a method of manufacturing a photodetector.

BACKGROUND

There have been known various photodetectors.

Although silicon photodetectors can be mass-produced at low cost, a photoelectric conversion efficiency is low particularly in an infrared region.

DETAILED DESCRIPTION

Figure 1A:
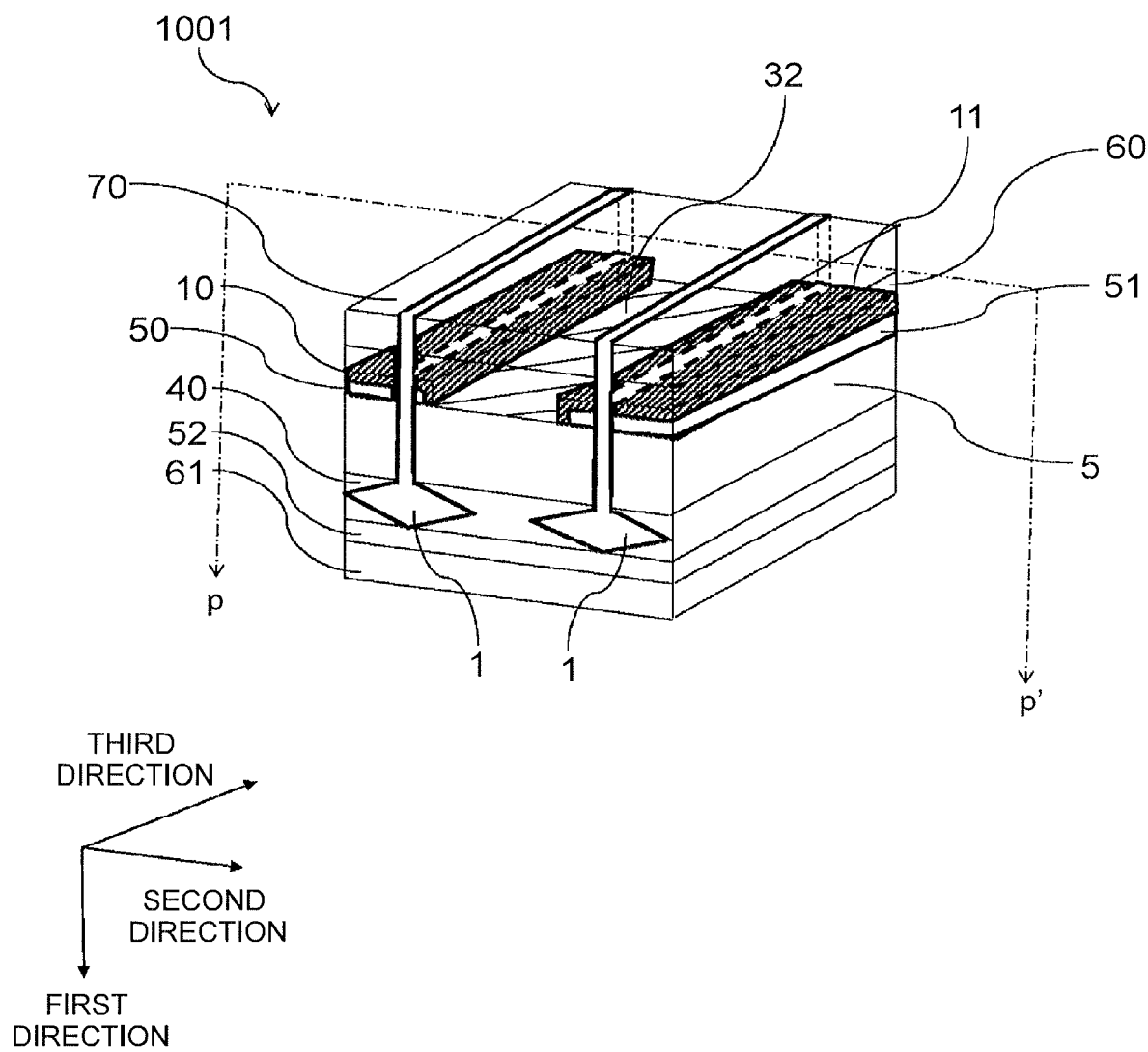
FIGS. 1A and 1B are diagrams illustrating a photodetector according to an embodiment.

Hereinafter, embodiments will be described with reference to the drawings.

Components denoted by the same reference numerals indicate corresponding ones.

The drawings are schematic or conceptual, and a relationship between thickness and width of each portion, a ratio of sizes among portions, and the like are not necessarily the same as actual ones. In addition, even in the case of representing the same portions, the sizes and ratios of the portions may be different from each other depending on figures in the drawings.

First Embodiment

FIG. 1A is a perspective view of a photodetector according to a first embodiment.

In FIG. 1A, a photodetector 1001 includes an n type semiconductor layer 40 (herein, a first semiconductor layer), a p type semiconductor layer 5 (herein, a second semiconductor layer) having a light-receiving surface for receiving light, first electrodes 10 and 11, insulating layers 50 and 51, cavity portions 1 and 1, a buried oxide layer (BOX) 52, a silicon substrate 61, a first layer 60, and a second layer 70.

Figure 1B:
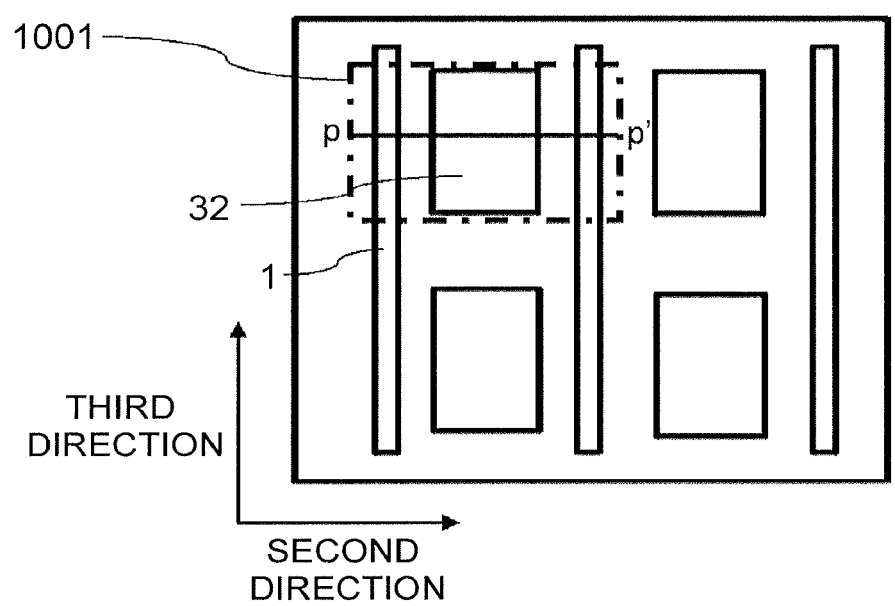

FIG. 1B is a view of the photodetector illustrated in FIG. 1A as viewed from the light incident side (upper surface side).

In FIG. 1B, the photodetector 1001 includes a cavity portion 1 and a light-receiving surface 32 provided between the cavity portions 1.

The photodetector 1001 photoelectrically converts the light incident on the light-receiving surface between the p type semiconductor layer 5 and the n type semiconductor layer 40 and detects as an electric signal through wires (not illustrated).

The BOX layer 52 is provided on the silicon substrate 61. An n type semiconductor layer 40 is provided on the BOX layer 52, and a p type semiconductor layer 5 is provided on the n type semiconductor layer 40. In the p type semiconductor layer 5, a $p^+$ type semiconductor layer 32 is provided at the top. The $p^+$ type semiconductor layer 32 is a light-receiving surface on which light is incident. The light-receiving surface has a shape of, for example, a quadrangle, and the length of one side is 10 μm or more and 100 μm or less. The p type semiconductor layer 5 may include a $p^-$ type semiconductor layer (not illustrated in FIG. 1) and a $p^+$ type semiconductor layer (not illustrated in FIG. 1) in addition to the $p^+$ type semiconductor layer 32.

The light incident on the p type semiconductor layer 5 from the light-receiving surface ($p^+$ type semiconductor layer 32) is directed toward the n type semiconductor layer 40. Hereinafter, a direction from the light-receiving surface to the n type semiconductor layer 40 is called a first direction (stacking direction). A direction intersecting the first direction and passing through the cavity portion is called a second direction (plane direction). A direction intersecting the first direction and the second direction is called a third direction. In the embodiment, "intersecting" indicates "substantially perpendicular to".

Insulating layers 50 and 51 are provided around the light-receiving surface, and electrodes 10 and 11 are provided thereon. The light-receiving surface and the electrodes 10 and 11 are in contact with each other. A first layer 60 is provided on the light-receiving surface and the electrodes 10 and 11, and a second layer 70 is provided on the first layer 60.

The photodetector 1001 according to the embodiment includes the cavity portion 1 in then type semiconductor layer 40. The cavity portion 1 further penetrate the second layer 70 and the first layer 60, the electrodes 10 and 11, the insulating layers 50 and 51, and the p type semiconductor layer 5 from the top with a predetermined width, respectively. A cross section taken along the second direction of each of the cavity portions 1 and 1 in the n type semiconductor layer 40 has a quadrangular shape (substantially rhombus shape) having apexes in the first direction and the second direction. The light incident from the light-receiving surface and passing through the p type semiconductor layer 5 and the n type semiconductor layer 40 is reflected at the boundary interface with respect to the cavity portion 1. The reflected light is directed again to the interface between the p type semiconductor layer 5 and the n type semiconductor layer 40. If the cross section taken along the second direction of the cavity portion 1 in the n type semiconductor layer 40 has a rhombus shape having the same area, since the above-described boundary surfaces have the same surface area, the incident light can be reflected to the interface between the p type semiconductor layer 5 and the n type semiconductor layer 40 without a dispersion.

The photodetector 1001 of the present embodiment may be used as APD (Avalanche photodiode).

The electrodes 10 and 11 are provided for wiring the electric signals photoelectrically converted by the interface between the p type semiconductor layer 5 and the n type semiconductor layer 40 to a driving/reading unit (not illustrated).

Figure 2:
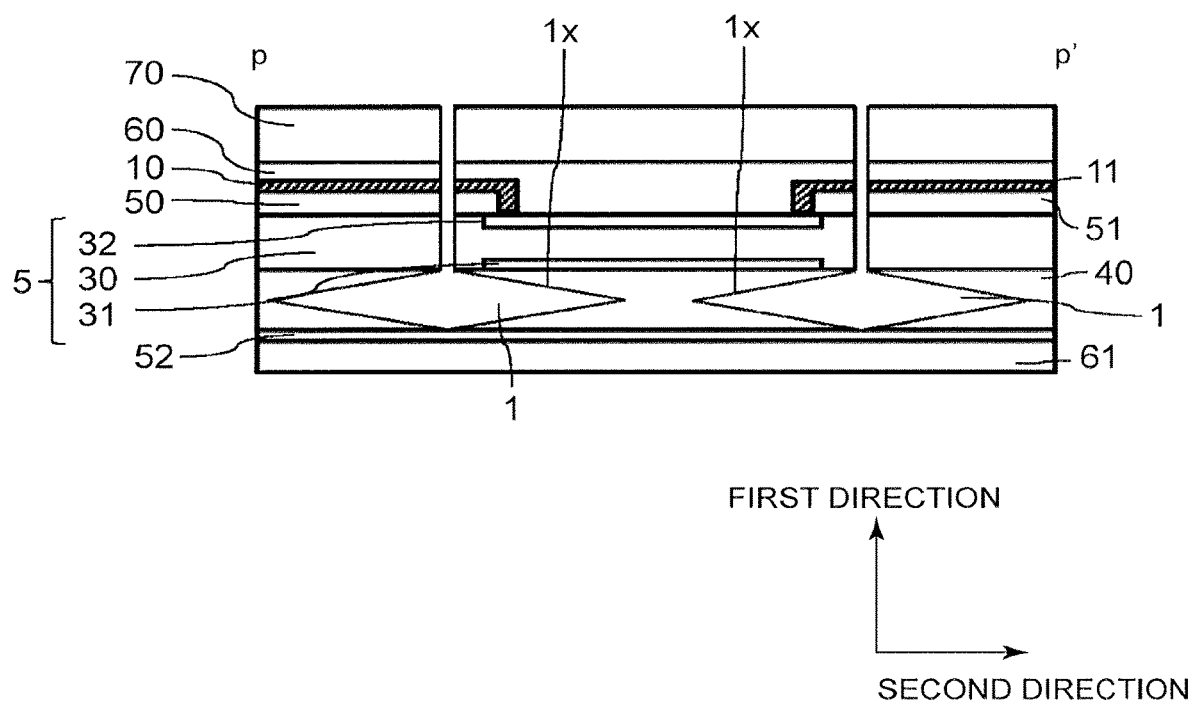
FIG. 2 is a p-p' cross-sectional view of the photodetector illustrated in FIG. 1 according to the embodiment.

FIG. 2 illustrates a p-p' cross section of the photodetector 1001 taken along the second direction. The p type semiconductor layer 5 is configured with a stack structure of a $p^+$ type semiconductor layer 31, a $p^-$ type semiconductor layer 30, and a $p^+$ type semiconductor layer 32. The $p^+$ type semiconductor layer 31 is provided on the n type semiconductor layer 40. The $p^-$ type semiconductor layer 30 is provided on the $p^+$ type semiconductor layer 31. A $p^+$ type semiconductor layer 32 that has a light-receiving surface for receiving light is provided on the $p^-$ type semiconductor layer 30. On the periphery of the light-receiving surface, insulating layers 50 and 51 are provided so as to cover the p-type semiconductor layer 30, and electrodes 10 and 11 are provided thereon. The electrodes 10 and 11 are in contact with the $p^+$ type semiconductor layer 32.

A cavity portion 1 is provided in the n type semiconductor layer 40. In addition, the cross section taken along the second direction of the cavity portion 1 has a quadrangular shape and is provided such that a reflection portion (reflection surface) 1x for reflecting the incident light exists. That is, the interface between the n type semiconductor layer 40 and the cavity portion 1 constitutes the reflection portion 1x. In the example of FIG. 2, two cavity portions 1 are provided in pairs along the second direction. By providing a plurality of the cavity portions 1 in the n type semiconductor layer 40 in the second direction, it is possible to improve photoelectric conversion efficiency by reflecting more incident light to the interface between the p type semiconductor layer 5 and the n type semiconductor layer 40 which performs photoelectrical conversion. In addition, the two adjacent cavity portions 1 and 1 are not in contact with each other, and the region therebetween cannot reflect the light incident from the light-receiving surface. Therefore, it is preferable that the interval between the cavity portions 1 and 1 of the n type semiconductor layer 40 is narrow in order to reflect much light. The acute angle between the reflection portion 1x of the cavity portion 1 and the plane including the first direction and the third direction is preferably 45° or more and 73° or less. In a case where the acute angle between the reflection portion 1x of the cavity portion 1 and the plane including the first direction and the third direction is smaller than 45°, the amount of the reflected light that is incident on the interface between the p type semiconductor layer 5 and the n type semiconductor layer 40 performing photoelectrical conversion decreases. In a case where the acute angle between the reflection portion 1x of the cavity portion 1 and the plane including the first direction and the third direction is larger than 73°, since the total reflection condition is not satisfied, the incident light is not totally reflected, and thus, the photoelectric conversion efficiency is decreased.

The semiconductors of the p type semiconductor layer 5 and the n type semiconductor layer 40 are made of, for example, Si (silicon).

The wavelength of the light incident on the $p^+$ type semiconductor layer 32 that is the light-receiving surface is assumed to be 750 nm or more and 1000 nm or less.

Figure 3A:
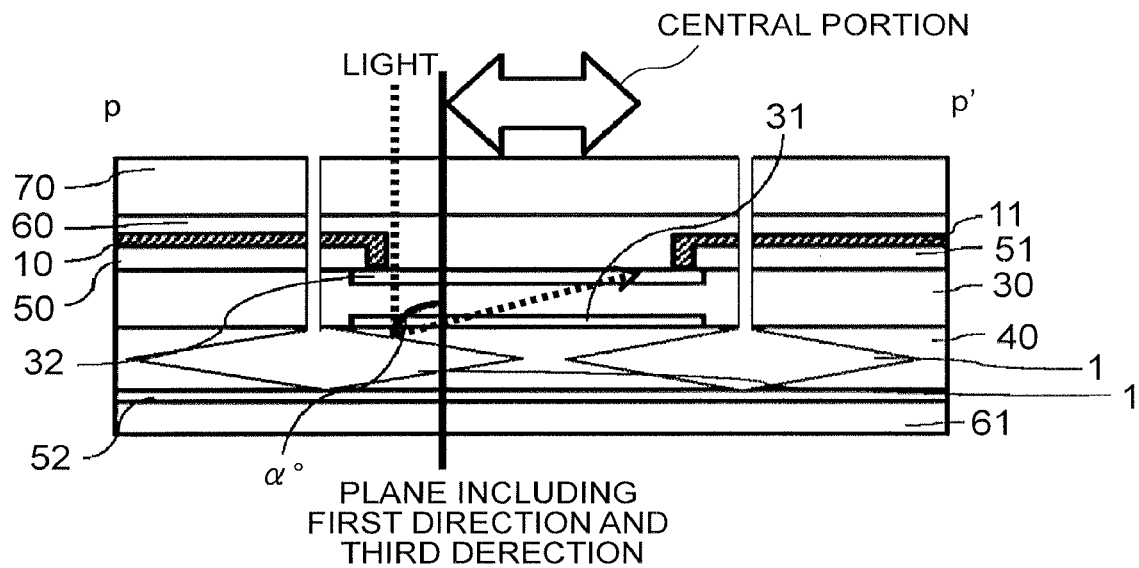
FIG. 3A and FIG. 3B are diagrams illustrating an optical path of light incident on a p-p' cross section of the photodetector according to the embodiment.
Figure 3B:
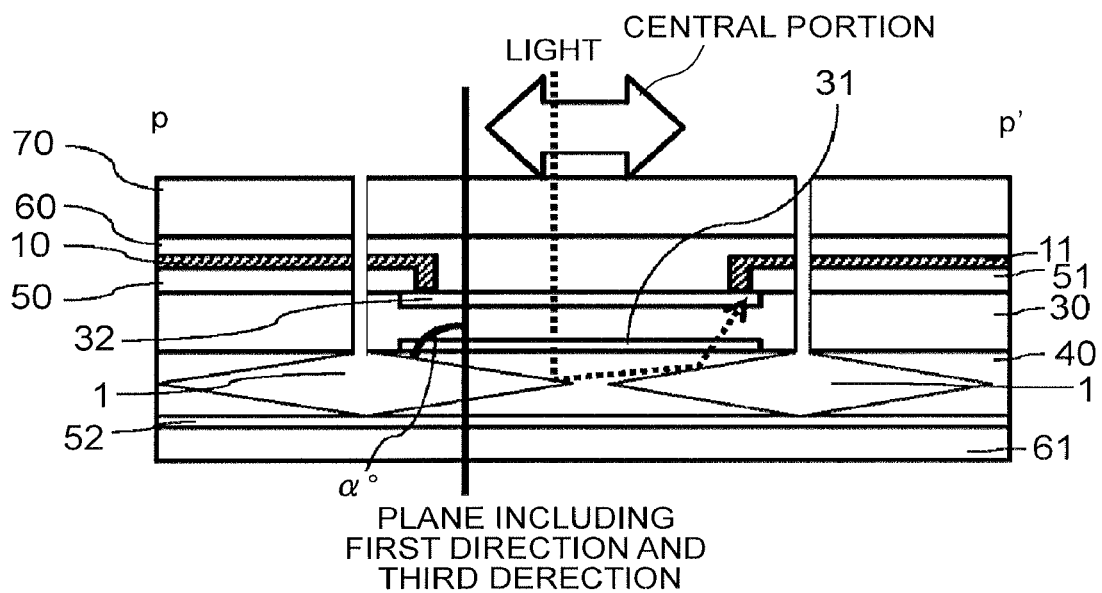

As illustrated in FIG. 3, the light that is incident substantially perpendicularly on the $p^+$ type semiconductor layer 32 from the outside of the photodetector is reflected by the reflection portion 1x of the quadrangular cavity portion 1 of the n type semiconductor layer 40. The light reflected by the cavity portion 1 passes through the interface between the $p^+$ type semiconductor layer 31 and the n type semiconductor layer 40 and is incident again to the $p^+$ type semiconductor layer 32.

The case is considered where the light reflected by the cavity portion 1 is incident to the interface between the first layer 60 and the $p^+$ type semiconductor layer 32. When the incident angle of light is larger than a critical angle determined by the reflective index of the first layer 60 and the reflective index of the $p^+$ type semiconductor layer 32, the light is totally reflected by the interface between the first layer 60 and the $p^+$ type semiconductor layer 32. Herein, the critical angle is the smallest incident angle at which total reflection occurs when the light is directed from a place where the reflective index is large to a place where the reflective index is small. Since the light is totally reflected and remains inside the photodetector 1001, the light can be confined inside the photodetector 1001. Therefore, it is possible to improve the photodetection efficiency of the photodetector 1001.

In addition, when the acute angle $\alpha°$ between the reflection surface 1x of cavity portion 1 and the plane including the first direction and the third direction is 54.7°, a ratio of the surface area of the cavity portion 1 where the light is reflected once by the cavity portion 1 (FIG. 3A) and is incident to the p type semiconductor layer 5 and the surface area of the cavity portion 1 where the light is reflected twice by the cavity portion 1 (FIG. 3B) and is incident to the p type semiconductor layer 5 becomes about 2:1. The light incident substantially perpendicularly on the central portion (about ⅓ of the pitch) of the light-receiving surface is reflected twice by the cavity portion 1 and, after that, is incident to the p type semiconductor layer 5. The pitch indicates the length of the light-receiving surface in the second direction. On the other hand, the light incident substantially perpendicularly on a portion other than the central portion of the light-receiving surface is reflected once by the cavity portion 1 and, after that, is incident to the p type semiconductor layer 5 at an angle of about 19.6°. As compared with a case where the cavity portion 1 is not provided, it is possible to obtain the effect that the optical path length in the photodetector is about 2.7 times. By providing the cavity portion 1, the frequency of light incident to the interface performing photoelectric conversion between the p type semiconductor layer 5 and the n type semiconductor layer 40 is increased as compared with a case where the cavity portion 1 is not provided, so that the photoelectric conversion efficiency is improved. In addition, if the condition that the total reflection of the light is satisfied again for the light that is obliquely incident to the p type semiconductor layer 5, the light is reflected by the cavity portion 1 and is incident again to the interface between the p type semiconductor layer 5 and the n type semiconductor layer 40.

FIG. 4 is a cross-sectional view of each process of the method of manufacturing the photodetector according to the embodiment.

Although the method of manufacturing the photodetector 1001 from a silicon on insulator (SOI) substrate is illustrated, a substrate including a silicon layer (for example, p type) epitaxially grown on a silicon substrate 61 (for example, n type) or the like may also be used.

Figure 4A:
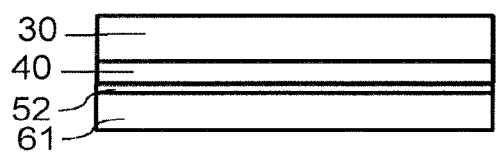
FIGS. 4A to 4E are cross-sectional view of steps of a method of manufacturing a photodetector according to an embodiment.

First, an SOI substrate is prepared. The SOI substrate has a structure in which a silicon substrate 61, a BOX layer 52, and an n type semiconductor layer 40 are stacked in this order. A p⁻ type semiconductor layer 30 is formed on the n type semiconductor layer 40 by epitaxial growth (FIG. 4A).

Since the BOX layer 52 is a silicon oxide film which is a material having high etching selectivity to silicon, the BOX layer can function as an etching stopper.

The n type semiconductor layer 40 can be obtained by implanting impurities of phosphorus (P), antimony (Sb), or arsenic (As) into silicon.

Next, impurities (for example, boron (B)) are implanted such that a portion of the p⁻ type semiconductor layer 30 becomes a p¹ type semiconductor layer 31. As a result, the p¹ type semiconductor layer 31 constituting the photodetection element is formed in a portion of the n type semiconductor layer 40 of the SOI Substrate. A first mask (not illustrated) is formed on the p⁻ type semiconductor layer 30, and a p¹ type semiconductor layer 32 to be a light-receiving surface is formed by implanting p type impurities by using the first mask. The p⁺ type semiconductor layers 31, 32 may be formed by using the first mask.

The p⁺ type semiconductor layer 32, the p⁻ type semiconductor layer 30, and the p⁺ type semiconductor layer 31 are obtained by implanting impurities such as boron.

After removing the first mask, a second mask (not illustrated) is formed on the p⁺ type semiconductor layer 32. By using the second mask, an insulating layer 50 and an insulating layer 51 are formed on the p⁻ type semiconductor layer 30.

The material of the insulating layers 50 and 51 is, for example, a silicon oxide film or a silicon nitride film, or a combination thereof.

A first electrode 10 is formed to cover the insulating layer 50 and the peripheral portion of the p⁺ type semiconductor layer 32. A first electrode 11 is formed to cover the insulating layer 51 and the peripheral portion of the p⁺ type semiconductor layer 32.

The material of the electrodes 10 and 11 is, for example, aluminum or an aluminum-containing material, or other metal materials.

Figure 4B:
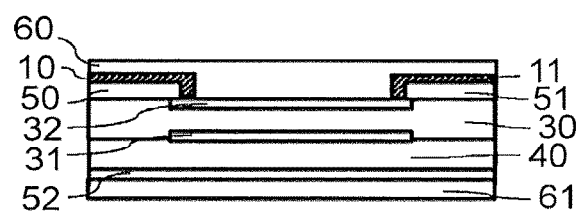

After the first electrodes 10 and 11 are formed, the second mask is removed. The first layer 60 is formed so as to cover the first electrodes 10 and 11, and a portion of the p⁺ type semiconductor layer 32. The material of the first layer 60 is, for example, a silicon oxide film or a silicon nitride film (FIG. 4B).

Figure 4C:
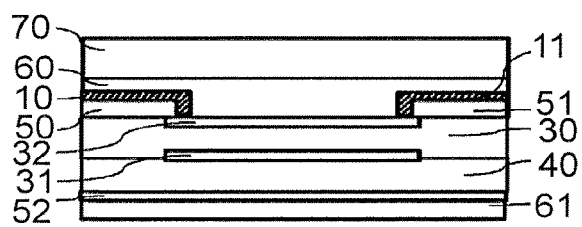

A second layer 70 is formed on the first layer 60. The second layer 70 is a resist. The second layer 70 may be formed directly on the first layer 60 or may be formed with a layer (not illustrated) interposed therebetween (FIG. 4C).

Figure 4D:
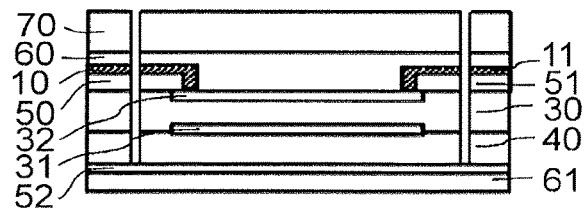

After that, by using the second layer 70 as a third mask, vertical etching is performed with a predetermined width to form a groove at the central portions of the electrodes 10 and 11 by a process of dry etching (for example, reactive ion etching (RIE)). Since BOX layer 52 has high RIE resistance, it is possible to suppress the variation in depth of the vertical etching (FIG. 4D).

Figure 4E:
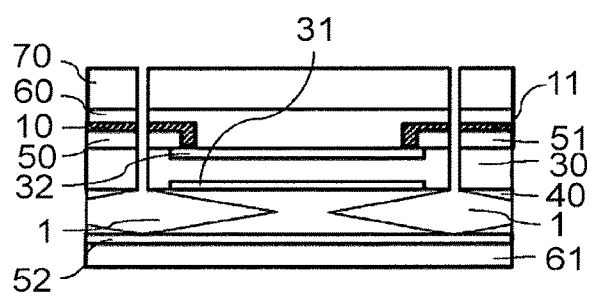

By performing wet etching using an alkaline solution such as tetra-methyl-ammonium hydroxide (TMAH), an alkaline solution as an etching solution flows into a cavity penetrating with a predetermined width, so that a quadrangular (substantially a rhombus shape) cavity portion 1 depending on the etching selectivity according to the orientation peculiar to the material of the n type semiconductor layer 40 is formed. However, the selectivity can be adjusted according to the type and concentration of the alkaline solution and other processing conditions, and the shape of the cavity portion can be slightly changed (FIG. 4E). By performing wet etching, for example, using an alkaline solution, (111) plane of silicon is exposed.

When the cavity portion 1 is formed by the above-described method, the cavity portion 1 can be manufactured in a self-aligning manner in an acute angle range of 45° to 73° between the reflection surface 1x of the cavity portion 1 and the plane including the first direction and the third direction.

Herein, in the case of using silicon or SOI of the (100) plane for the n type semiconductor layer 40 with the light-receiving surface as the (100) plane, the cavity has a quadrangular shape (rhombus shape) where the direction from the light-receiving surface to the n type semiconductor layer 40 is longer than the direction substantially perpendicular to the direction from the light-receiving surface to the n type semiconductor layer 40, or a square cavity is formed. On the other hand, in a case where the silicon or SOI of a (110) plane is used as the silicon or SOI used for the n type semiconductor layer 40, since the cavity has a rhombus shape where a direction substantially perpendicular to the direction from the light-receiving surface to the n type semiconductor layer 40 is longer than the direction from the light-receiving surface to the n type semiconductor layer 40, it is more preferable in that the surface area of the reflection surface can be increased. Besides the silicon described above, an isotropic silicon may be used.

In a case where a plurality of the photodetectors are provided, the photodetectors may be connected in parallel in the two-dimensional direction by wiring, or the photodetectors may be individually connected to a reading circuit.

According to the embodiment, a photodetector with an improved photoelectric conversion efficiency is provided.

The photodetector according to the embodiment can improve the light absorption efficiency as compared with a photodetector of the related art.

In addition, in the embodiment, regardless of the example in FIG. 2, at least one cavity portion 1 may be required for one photodetector. In order to improve the structural and chemical stability of the cavity portion 1, it is also possible to fill the cavity portion with an organic resin or a metal. As the organic resin, materials such as dimethylpolysiloxane (PDMS) and epoxy resin (SU-8) may be exemplified, because these materials are high in filling property, low in optical refractive index, and high in chemical stability. On the other hand, in a case where the cavity portion is filled with a metal, the fill is formed by sputtering, vapor deposition, or plating. As the material of the metal, for example, materials such as copper, nickel, gold, tungsten and the like may be exemplified.

In addition, a step of forming a protective film for protecting the sidewall of the cavity may be added to the step between FIG. 4D and FIG. 4E. FIGS. 5A to 5G are cross-sectional view illustrating another process of the method of manufacturing the photodetector according to the embodiment.

Figure 5A:
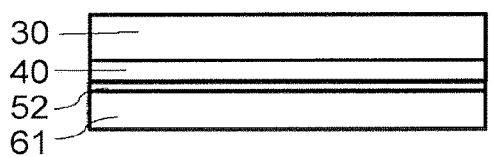
FIGS. 5A to 5G are cross-sectional view of steps of another method of manufacturing a photodetector according to an embodiment.

First, an SOI substrate is prepared. The SOI substrate has a structure in which a silicon substrate 61, a BOX 52, and an n type semiconductor layer 40 are stacked in this order. A p⁻ type semiconductor 30 is formed on the n type semiconductor layer 40 by epitaxial growth (FIG. 5A).

Since the BOX 52 is a silicon oxide film of a material having a high etching selectivity to silicon, the BOX can function as an etching stopper.

The n type semiconductor layer 40 is obtained by implanting impurities of phosphorus (P), antimony (Sb) or arsenic (As) into silicon.

Next, impurities (for example, boron (B)) are implanted so that a portion of the p⁻ type semiconductor 30 is converted into the p⁺ type semiconductor 31. As a result, the p⁺ type semiconductor 31 constituting the photodetection element is formed in the portion of the n type semiconductor layer 40 of the SOI substrate. A first mask (not illustrated) is formed on the p⁻ type semiconductor layer 30, and a p⁺ type semiconductor 32 to be a light-receiving surface is formed by implanting p type impurities using the first mask.

The p⁺ type semiconductor layer 32, the p⁻ type semiconductor layer 30, and the p⁺ type semiconductor layer 31 can be obtained by implanting impurities such as boron.

After removing the first mask, a second mask (not illustrated) is formed on the p⁺ type semiconductor 32. By using the second mask, an insulating layer 50 and an insulating layer 51 are formed on the p⁻ type semiconductor 30.

The material of the insulating layers 50 and 51 is, for example, a silicon oxide film or a silicon nitride film, or a combination thereof.

The first electrode 10 is formed so as to cover the insulating layer 50 and the peripheral portion of the p⁺ type semiconductor 32. The second electrode 11 is formed so as to cover the insulating layer 51 and the peripheral portion of the p⁺ type semiconductor 32.

The material of the electrodes 10 and 11 is, for example, aluminum or an aluminum-containing material, or another metallic material combined with the material.

Figure 5B:
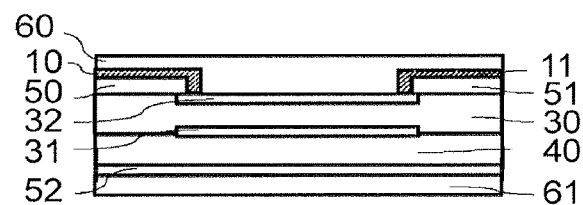

After forming the first electrode 10 and the second electrode 11, the second mask is removed. A first layer 60 is formed so as to cover the first electrode 10, the second electrode 11, and a portion of the p⁺ type semiconductor 32. The material of the first layer 60 is, for example, a silicon oxide film or a silicon nitride film (FIG. 5B).

Figure 5C:
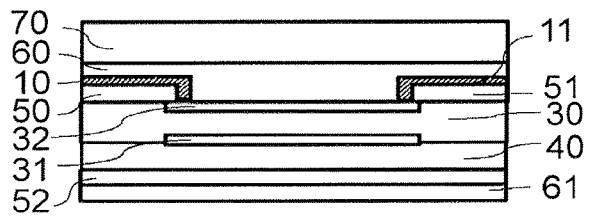

A second layer 70 is formed on the first layer 60. The second layer 70 is a resist. The second layer 70 may be formed directly on the first layer 60 or may be patterned with respect to the first layer 60 with a layer not illustrated interposed therebetween (FIG. 5C).

Figure 5D:
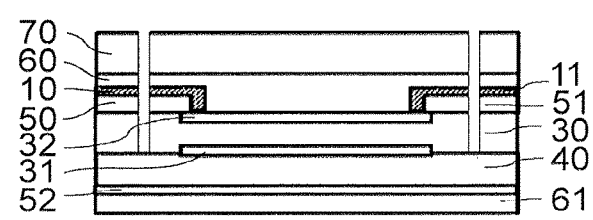

After that, by using the second layer 70 as a third mask, vertical processing is performed with a predetermined width at the central portions of the electrodes 10 and 11 by a process of dry etching (for example, reactive ion etching (RIE)) until down to the depth where the p⁻ type semiconductor 30 is penetrated (FIG. 5D).

Figure 5E:
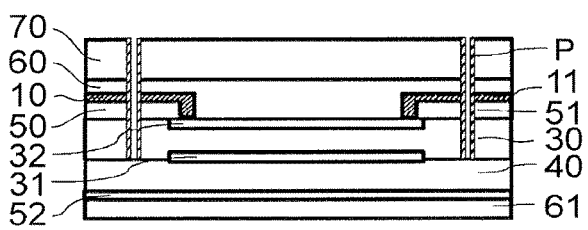

An oxide film or a nitride film is formed by chemical vapor deposition (CVD) on the side wall of the cavity vertically processed with a predetermined width. For example, a tetraethyl orthosilicate film is used as the oxide film, and a CVD film is used as the nitride film (FIG. 5E).

Figure 5F:
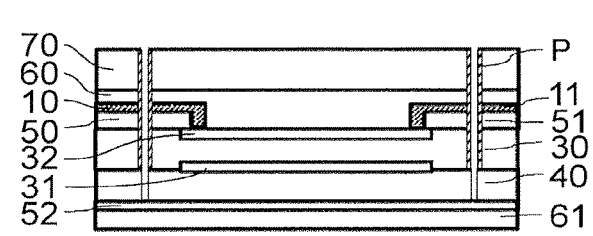

After that, the cavity in which a protective film P is formed is further subjected to vertical processing with a predetermined width by the RIE process, and the cavity is allowed to penetrate the n-type semiconductor layer 40. Since the BOX 52 has high resistance to RIE, it is possible to suppress the dispersion in depth of the vertical processing (FIG. 5F).

Figure 5G:
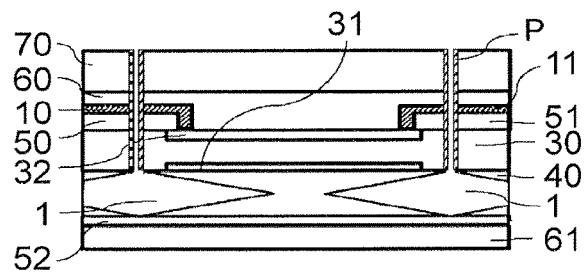

By performing wet etching using an alkaline solution such as tetra-methyl-ammonium hydroxide (TMAH), an alkaline solution as an etching solution flows into the cavity penetrating with a predetermined width, so that a quadrangular (substantially rhombus) cavity portion 1 depending on the etching selectivity according to the orientation peculiar to the material of the n type semiconductor layer 40 is formed. However, the selectivity can be adjusted according to the type and concentration of the alkaline solution and other processing conditions, and the shape of the cavity portion can be slightly changed (FIG. 5G).

As described above, it is preferable that the protective film is provided to the cavity portion because damage due to etching can be reduced.

In addition, regardless of the example of FIG. 2, an oxide film may be provided between the cavity portions 1 in order to prevent the increase of the cavity portion 1 which cannot perform totally reflection due to the connection of the cavity portions 1. At the time of vertical etching in RIE of FIG. 4D and FIG. 5D, the center of the light-receiving surface of the photodetector may be further vertically etched at a position different from the through hole, and for example, an oxide film is buried, and thus, the oxide film described above is provided. As a result, the oxide film becomes a stopper of the cavity portions 1 grown by etching, so that the oxide film prevents the cavity portions 1 from being connected to each other.

In addition, unlike the above example, the first semiconductor layer may be a p type semiconductor layer, and the second semiconductor layer may be an n type semiconductor layer. In that case, a cavity portion is provided in the p type semiconductor layer, and the cavity portion has the above-described quadrangular shape. In that case, silicon or SOI of the (100) plane or the (110) plane is used as silicon or SOI used for the p type semiconductor layer. Besides, in the above embodiments, a pn junction is formed at the interface between the first semiconductor region 40 and the second semiconductor region 50. However, the pn junction may be formed in the second semiconductor region 50.

Besides, the first direction may be called as a direction extending from the first semiconductor layer to the second semiconductor layer, or a direction extending from the second semiconductor layer to the first semiconductor layer.

Second Embodiment

Figure 6:
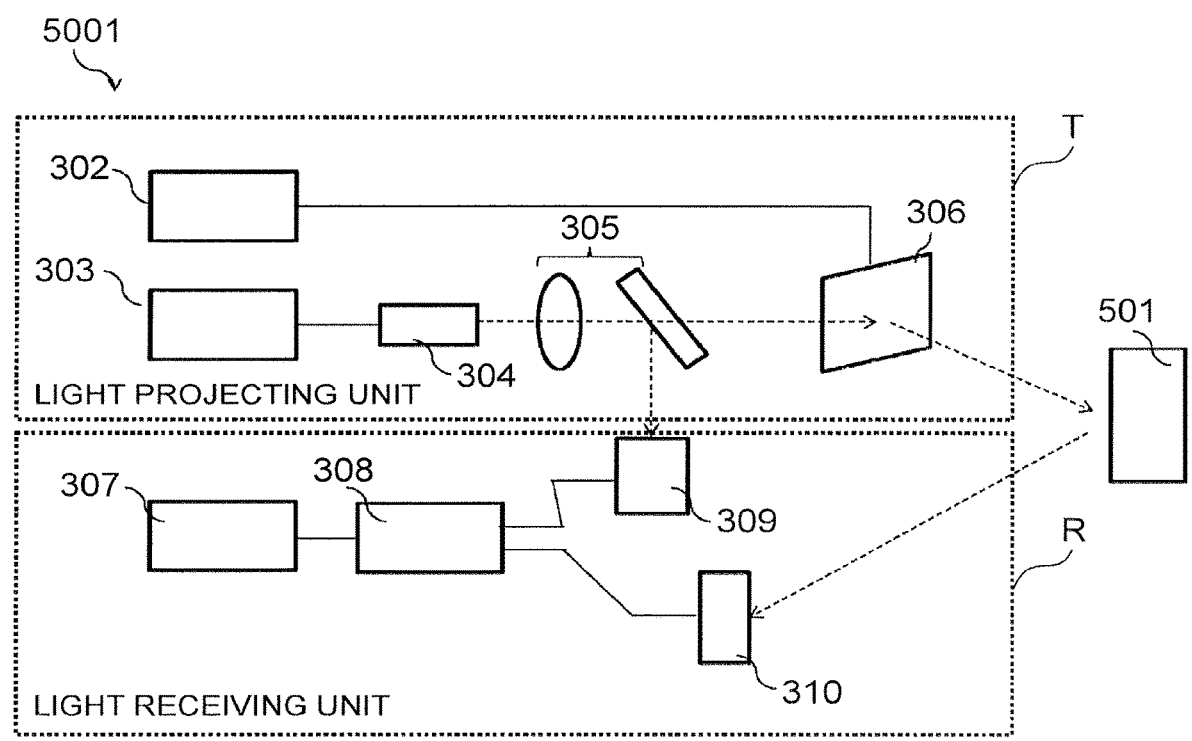
FIG. 6 is a diagram illustrating a LIDAR apparatus according to an embodiment.

FIG. 6 illustrates a LIDAR (laser imaging detection and ranging: LIDAR) apparatus 5001 according to the embodiment.

This embodiment can be applied to a long-distance subject detection system (LIDAR), or the like, along with a line light source and a lens. The LIDAR apparatus 5001 includes a light projecting unit T that projects laser light to an object 501, a light receiving unit R (also referred to as a photodetection system) that receives the laser light from the object 501 and measures a time when the laser light goes to and return from the object 501 and converts the time into a distance.

In the light projecting unit T, the laser light oscillator 304 oscillates laser light. A driving circuit 303 drives the laser light oscillator 304. The optical system 305 extracts a portion of the laser light as a reference light and irradiates the object 501 with the other laser light through the mirror 306. The mirror controller 302 controls the mirror 306 to project the laser light onto the object 501. Herein, projecting means irradiating with light.

In the light receiving unit R, the reference-light photodetector 309 detects the reference light extracted by the optical system 305. The photodetector 310 receives reflected light from the object 501. The distance measurement circuit 308 measures the distance to the object 501 based on the reference light detected by the reference-light photodetector 309 and the reflected light detected by the photodetector 310. The image recognition system 307 recognizes the object 501 based on a result measured by the distance measurement circuit 308.

The LIDAR apparatus 5001 adopts a time-of-flight (TOF) distance measurement method which measures a time when the laser light goes to and return from the object 501 and converts the time into a distance. The LIDAR apparatus 5001 is applied to an on-vehicle drive-assist system, remote sensing, or the like. When the photodetector 1001 is used as the photodetector 310, the photodetector exhibits good sensitivity particularly in a near infrared region. Therefore, the LIDAR apparatus 5001 can be applied to a light source to a wavelength band invisible to a person. For example, the LIDAR apparatus 5001 can be used for detecting obstacles for vehicles.

Figure 7:
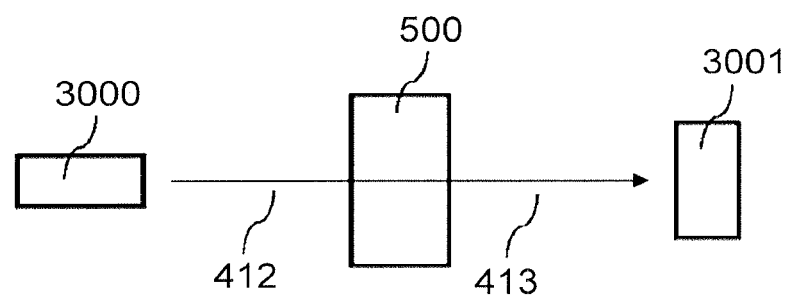
FIG. 7 is diagram illustrating a measurement system of an LIDAR apparatus according to an embodiment.

FIG. 7 is a diagram illustrating the detection of the detection target of the LIDAR apparatus.

The light source 3000 emits light 412 to an object 500 as the detection target. The photodetector 3001 detects the light 413 transmitted through, reflected by, or diffused by the object 500.

For example, when the photodetector 3001 is used as the above-described photodetector 1001, a highly sensitive measurement system is embodied.

It is preferable that a plurality of sets of the photodetector 3001 and the light source 3000 are provided and the arrangement relationship thereof is defined by software (also substitutable by a circuit) in advance. It is preferable that the sets of the photodetector 3001 and the light source 3000 are provided, for example, at equal intervals as the arrangement relationship. Accordingly, by complementing the output signals of the photodetectors 310, it is possible to generate an accurate three-dimensional image.

Figure 8:
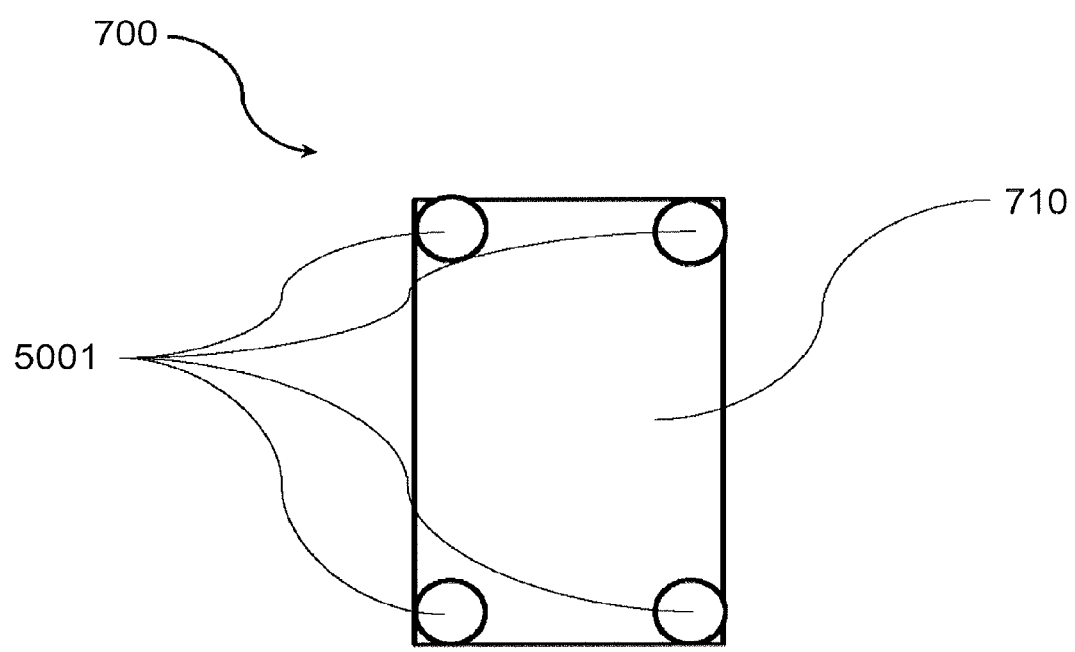
FIG. 8 is a schematic top view of a vehicle equipped with a LIDAR apparatus according to an embodiment.

FIG. 8 is a schematic top view of a vehicle equipped with the LIDAR apparatus according to the embodiment.

The vehicle 700 according to the embodiment includes the LIDAR apparatus 5001 at each of the four corners of a vehicle body 710.

The vehicle according to the embodiment can detect the environment in all directions of the vehicle by the LIDAR apparatus by providing the LIDAR apparatus at each of the four corners of the vehicle body.

While several embodiments of the invention have been described above, the above-described embodiments have been presented byway of examples only, and the embodiments are not intended to limit the scope of the invention. The embodiments described herein may be embodied in a variety of other forms; furthermore, various omissions, substitutions, and changes in the form of the embodiments described herein may be made within the scope without departing from the spirit of the invention. The embodiments and modifications thereof are included in the scope and spirit of the invention and fall within the scope of the invention described in the claims and the equivalents thereof.

What is claimed is:

1. A photodetector comprising:
a first semiconductor layer; and
a second semiconductor layer provided on the first semiconductor layer and detecting light,
wherein the first semiconductor layer has a cavity portion having an inclined surface for reflecting incident light.

2. A photodetector comprising:
a first semiconductor layer; and
a second semiconductor layer provided on the first semiconductor layer and detecting light,
wherein the first semiconductor layer has a cavity portion for reflecting incident light and the cavity portion reflects incident light to the second semiconductor layer.

3. A photodetector comprising:
a first semiconductor layer; and
a second semiconductor layer provided on the first semiconductor layer and detecting light,
wherein the first semiconductor layer has a cavity portion for reflecting incident light and a plurality of cavity portions are provided in the first semiconductor layer in a second direction intersecting a first direction that extends from the first semiconductor layer to the second semiconductor layer.

4. The photodetector according to claim 1, wherein a cross section of the cavity portion includes a first direction extending from the first semiconductor layer to the second semiconductor layer and a second direction intersecting the first direction, the cavity portion has a quadrangular shape, and a length in the first direction is equal to or greater than that in the second direction.

5. The photodetector according to claim 1, wherein the cavity portion reflects incident light to the second semiconductor layer.

6. The photodetector according to claim 1, wherein a cross section of the cavity portion has a rhombus shape.

7. The photodetector according to claim 1, wherein a cross section of the cavity portion includes a first direction extending from the first semiconductor layer to the second semiconductor layer and a second direction intersecting the first direction, the cavity portion has a quadrangular shape, and a length in the second direction is longer than that in the first direction.

8. The photodetector according to claim 1, wherein the first semiconductor layer is silicon.

9. The photodetector according to claim 1, wherein a plurality of cavity portions are provided in the first semiconductor layer in a second direction intersecting a first direction that extends from the first semiconductor layer to the second semiconductor layer.

10. The photodetector according to claim 1, wherein an interface between the first semiconductor layer and the cavity portion provides a reflection surface reflecting the incident light, and an acute angle between the reflection surface and a plane including a first direction extending from the first semiconductor layer to the second semiconductor layer and a third direction intersecting the first direction is 45° or more.

11. The photodetector according to claim 10, wherein the acute angle is 45° or more and 73° or less.

12. The photodetector according to claim 7, wherein the first semiconductor layer has a (110) plane as a light-receiving surface.

13. The photodetector according to claim 4, wherein the first semiconductor layer has a (100) plane as a light-receiving surface.

14. The photodetector according to claim 1, wherein the first semiconductor layer includes an n type semiconductor.

15. The photodetector according to claim 1, wherein the first semiconductor layer includes a p type semiconductor.

16. A photodetection system comprising:
the photodetector according to claim 1; and
a distance measurement circuit calculating a time-of-flight of light from an output signal of the photodetector.

17. A LIDAR apparatus comprising:
a light source for irradiating light on an object; and the photodetection system according to claim 16 for detecting light reflected by the object.

18. The LIDAR apparatus according to claim 17, further comprising a system for generating a three-dimensional image on the basis of an arrangement relationship between the light source and the photodetector.

19. A vehicle comprising:

the LIDAR apparatus according to claim 17 at each of four corners of a vehicle body.

20. A photodetection system comprising:

the photodetector according to claim 2; and a distance measurement circuit calculating a time-of-flight of light from an output signal of the photodetector.

21. A photodetection system comprising:

the photodetector according to claim 3; and a distance measurement circuit calculating a time-of-flight of light from an output signal of the photodetector.

22. The photodetector according to claim 1, wherein the first semiconductor layer has a portion in which the cavity portion is not formed below central portion of a light-receiving surface of a cell.

* * * * *